(12) United States Patent
Inagaki et al.

(10) Patent No.: US 12,454,757 B2
(45) Date of Patent: Oct. 28, 2025

(54) HEAT TREATMENT APPARATUS, CONTROL METHOD, AND STORAGE MEDIUM

(71) Applicant: Tokyo Electron Limited, Tokyo (JP)

(72) Inventors: Morihito Inagaki, Yamanashi (JP); Takuya Higuchi, Iwate (JP); Hideomi Hane, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 105 days.

(21) Appl. No.: 18/073,798

(22) Filed: Dec. 2, 2022

(65) Prior Publication Data

US 2023/0175137 A1 Jun. 8, 2023

(30) Foreign Application Priority Data

Dec. 6, 2021 (JP) .................. 2021-198044

(51) Int. Cl.
 *C23C 16/52* (2006.01)
 *C23C 16/455* (2006.01)
 (Continued)

(52) U.S. Cl.
 CPC ........ *C23C 16/52* (2013.01); *C23C 16/45544* (2013.01); *C23C 16/4584* (2013.01);
 (Continued)

(58) Field of Classification Search
 CPC .............. H01J 37/321; H01J 37/3211; H01J 37/32119; H01J 37/32477; H01J 37/32486; H01J 37/32495; H01J 37/32504; H01J 37/32522; H01J 37/32724; H01J 37/32779; H01J 37/32853; H01J 37/32862; H01J 37/3288; H01J 37/32908; C23C 16/4404; C23C 16/4411; C23C 16/45519; C23C 16/45536; C23C 16/45538;
 (Continued)

(56) References Cited

U.S. PATENT DOCUMENTS 2,619,433 A * 11/1952 Davis ...................... C23C 16/16
 29/DIG. 39
6,000,830 A * 12/1999 Asano .............. G05B 19/41855
 700/121

(Continued)

FOREIGN PATENT DOCUMENTS

JP 2008-218558 A 9/2008

*Primary Examiner* — Kurt Sweely
(74) *Attorney, Agent, or Firm* — Venjuris, P.C.

(57) ABSTRACT

A heat treatment apparatus includes a control device. The control device includes a heat treatment control unit that controls a heat treatment performed on a processing target accommodated in a processing container, according to a process condition, a cleaning control unit that controls a cleaning process on deposits adhering to the processing container due to the heat treatment, a cumulative film thickness specification unit that specifies a value of a cumulative film thickness of the deposits adhering to the processing container, based on the process condition for the heat treatment, and a temperature correction unit that corrects a temperature of the heat treatment based on a temperature correction amount corresponding to the value of the cumulative film thickness and a frequency of the cleaning process.

10 Claims, 9 Drawing Sheets

(51) Int. Cl.
  *C23C 16/458* (2006.01)
  *C23C 16/46* (2006.01)
  *C23C 16/48* (2006.01)
  *C23C 16/50* (2006.01)
  *H01J 37/32* (2006.01)
  *H01L 21/67* (2006.01)

(52) U.S. Cl.
  CPC ........ *C23C 16/46* (2013.01); *H01L 21/67248* (2013.01); *H01L 21/67253* (2013.01); *C23C 16/45536* (2013.01); *C23C 16/45551* (2013.01); *C23C 16/482* (2013.01); *C23C 16/50* (2013.01); *H01J 37/321* (2013.01); *H01J 37/32522* (2013.01)

(58) Field of Classification Search
  CPC .......... C23C 16/4554; C23C 16/45542; C23C 16/45544; C23C 16/45548; C23C 16/45551; C23C 16/45578; C23C 16/4584; C23C 16/46; C23C 16/482; C23C 16/50; C23C 16/52; H01L 21/67115; H01L 21/67248; H01L 21/67253
  See application file for complete search history.

(56) References Cited

U.S. PATENT DOCUMENTS

| | | | | |
|---|---|---|---|---|
| 7,896,649 | B2* | 3/2011 | Koyama | H01L 21/67109 700/121 |
| 10,221,480 | B2* | 3/2019 | Kato | C23C 16/45551 |
| 10,773,282 | B2* | 9/2020 | Coppa | H01J 37/32697 |
| 2008/0213716 | A1* | 9/2008 | Koyama | H01L 21/67248 432/120 |
| 2016/0211157 | A1* | 7/2016 | Inoshima | H01L 21/68757 |
| 2017/0067160 | A1* | 3/2017 | Kato | H01L 21/68764 |
| 2017/0287791 | A1* | 10/2017 | Coppa | H01J 37/32697 |
| 2020/0043709 | A1* | 2/2020 | Agarwal | C23C 16/45544 |

* cited by examiner

FIG. 5

EDIT SCREEN

DRY CLEANING FREQUENCY EDIT — 1002

| | | | |
|---|---|---|---|
| TABLE 1 | 1 | TABLE 6 | 6 |
| TABLE 2 | 2 | TABLE 7 | 7 |
| TABLE 3 | 3 | TABLE 8 | 8 |
| TABLE 4 | 4 | TABLE 9 | 9 |
| TABLE 5 | 5 | TABLE 10 | 10 |

1010, 1012

TEMPERATURE CORRECTION TABLE EDIT — 1004

| | REFERENCE FILM THICKNESS [mm] | REGION 1 [°C] | REGION 2 [°C] | REGION 3 [°C] | REGION 4 [°C] | REGION 5 [°C] |
|---|---|---|---|---|---|---|
| LINE 1 | 100 | 0.0 | 0.1 | 0.2 | 0.3 | 0.4 |
| LINE 2 | 150 | 0.1 | 1.1 | 1.2 | 1.3 | 1.4 |
| LINE 3 | 200 | 0.2 | 2.1 | 2.2 | 2.3 | 2.4 |
| LINE 4 | 250 | 0.3 | 3.1 | 3.2 | 3.3 | 3.4 |
| LINE 5 | 300 | 0.4 | 4.1 | 4.2 | 4.3 | 4.4 |

TABLE RESET — 1006    NEXT PAGE — 1008

END    STOP    STORE

EDIT SCREEN

DRY CLEANING FREQUENCY EDIT — 1002

| DRY CLEANING FREQUENCY | | |
|---|---|---|
| TABLE 1 | 1 | TABLE 6 | 6 |
| TABLE 2 | 2 | TABLE 7 | 7 |
| TABLE 3 | 3 | TABLE 8 | 8 |
| TABLE 4 | 4 | TABLE 9 | 9 |
| TABLE 5 | 5 | TABLE 10 | 10 |

1010, 1012

TEMPERATURE CORRECTION TABLE EDIT — 1004

| | REFERENCE FILM THICKNESS [mm] | REGION 1 [°C] | REGION 2 [°C] | REGION 3 [°C] | REGION 4 [°C] | REGION 5 [°C] |
|---|---|---|---|---|---|---|
| LINE 1 | 0 | 0.0 | 0.0 | 0.0 | 0.0 | 0.0 |
| LINE 2 | 0 | 0.0 | 0.0 | 0.0 | 0.0 | 0.0 |
| LINE 3 | 0 | 0.0 | 0.0 | 0.0 | 0.0 | 0.0 |
| LINE 4 | 0 | 0.0 | 0.0 | 0.0 | 0.0 | 0.0 |
| LINE 5 | 0 | 0.0 | 0.0 | 0.0 | 0.0 | 0.0 |

END  STOP  STORE  TABLE RESET — 1006  NEXT PAGE — 1008

EDIT SCREEN

TEMPERATURE CORRECTION TABLE EDIT

| | REFERENCE-FILM THICKNESS [mm] | REGION 1 [°C] | REGION 2 [°C] | REGION 3 [°C] | REGION 4 [°C] | REGION 5 [°C] |
|---|---|---|---|---|---|---|
| LINE 1 | 100 | 0.0 | 0.1 | 0.2 | 0.3 | 0.4 |
| LINE 2 | 150 | 0.1 | 1.1 | 1.2 | 1.3 | 1.4 |
| LINE 3 | 200 | 0.2 | 2.1 | 2.2 | 2.3 | 2.4 |
| LINE 4 | 250 | 0.3 | 3.1 | 3.2 | 3.3 | 3.4 |
| LINE 5 | 300 | 0.4 | 4.1 | 4.2 | 4.3 | 4.4 |

DRY CLEANING FREQUENCY EDIT

| TABLE 1 | 0 | TABLE 6 | 0 |
| TABLE 2 | 2 | TABLE 7 | 7 |
| TABLE 3 | 3 | TABLE 8 | 8 |
| TABLE 4 | 4 | TABLE 9 | 9 |
| TABLE 5 | 5 | TABLE 10 | 10 |

[END] [STOP] [STORE] [TABLE RESET] [NEXT PAGE]

FIG. 8B

| MAINTENANCE MANAGEMENT ITEM FREQUENCY OF DRY CLEANING PROCESS | USABLE TABLE |
|---|---|
| 0 TIMES TO 2 TIMES | NONE |
| 3 TIMES | TABLE 2 |
| 4 TIMES | TABLE 3 |
| 5 TIMES | TABLE 4 |
| 6 TIMES | TABLE 5 |
| 7 TIMES | TABLE 5 |
| 8 TIMES | TABLE 7 |
| 9 TIMES | TABLE 8 |
| 10 TIMES | TABLE 9 |
| 11 TIMES | TABLE 10 |
| 12 TIMES TO 99 TIMES | TABLE 10 |

FIG. 8A

| DRY CLEANING FREQUENCY EDIT | | | |
|---|---|---|---|
| TABLE 1 | 0 | TABLE 6 | 0 |
| TABLE 2 | 3 | TABLE 7 | 8 |
| TABLE 3 | 4 | TABLE 8 | 9 |
| TABLE 4 | 5 | TABLE 9 | 10 |
| TABLE 5 | 6 | TABLE 10 | 11 |

1002
1012
1010

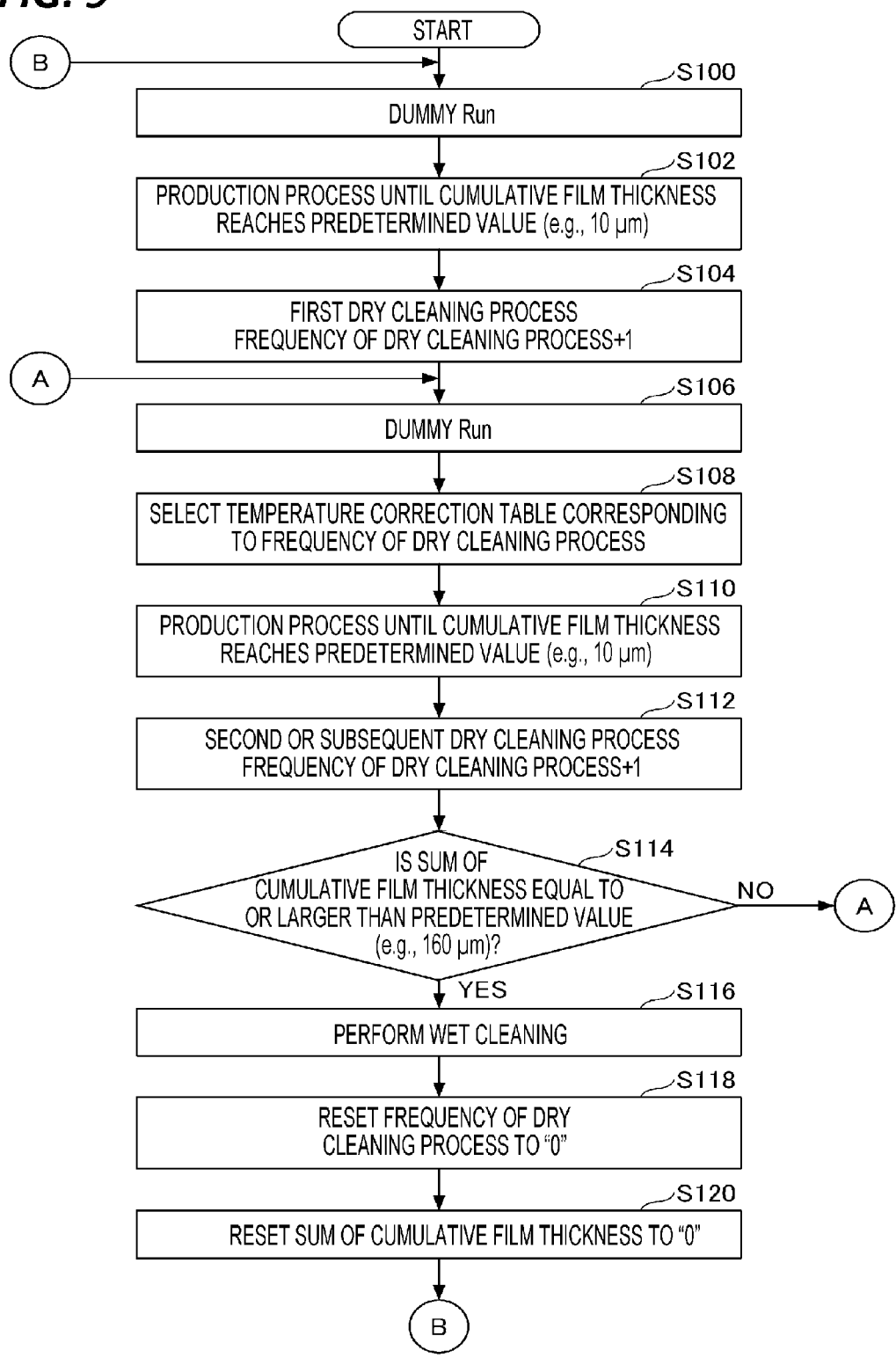

HEAT TREATMENT APPARATUS, CONTROL METHOD, AND STORAGE MEDIUM

CROSS-REFERENCE TO RELATED APPLICATIONS

The present application is based on and claims priority from Japanese Patent Application No. 2021-198044, filed on Dec. 6, 2021, with the Japan Patent Office, the disclosure of which is incorporated herein in its entirety by reference.

TECHNICAL FIELD

The present disclosure relates to a heat treatment apparatus, a control method, and a storage medium.

BACKGROUND

In a semiconductor device manufacturing process, a heat treatment system is used which performs, for example, a film forming process on a processing target such as a semiconductor wafer. In the heat treatment system, processing conditions such as a processing temperature, a processing pressure, and a gas flow rate are determined according to a film type and a film thickness of a thin film to be formed, and a recipe is prepared which records the processing conditions. In the heat treatment system, by selecting the recipe corresponding to the film type and the film thickness of the thin film, for example, the film forming process is performed based on predetermined processing conditions.

In the heat treatment system of prior art, a temperature correction table is stored, which represents a relationship between a cumulative film thickness of deposits adhering to the inside of a heat treatment apparatus and a temperature correction amount, for each internal temperature (processing temperature) of the apparatus, and the temperature correction amount is specified based on the processing temperature and the cumulative film thickness (see, e.g., Japanese Patent Laid-Open Publication No. 2008-218558).

SUMMARY

According to an aspect of the present disclosure, a heat treatment apparatus includes: a control device. The control device includes a heat treatment control unit that controls a heat treatment performed on a processing target accommodated in a processing container, according to a process condition, a cleaning control unit that controls a cleaning process on deposits adhering to the processing container due to the heat treatment, a cumulative film thickness specification unit that specifies a value of a cumulative film thickness of the deposits adhering to the processing container, based on the process condition for the heat treatment, and a temperature correction unit that corrects a temperature of the heat treatment based on a temperature correction amount corresponding to the value of the cumulative film thickness and a frequency of the cleaning process.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIG. 5 is an image view of an example of an edit screen.

FIG. 6 is an image view illustrating an example of an edit screen in which data of a temperature correction table are reset.

FIG. 7 is an image view of an example of an edit screen in which an unused temperature edit table is set.

FIGS. 8A and 8B are views illustrating an example of a process of selecting one temperature correction table corresponding to a frequency of a dry cleaning process FIG. 9 is a flowchart illustrating an example of an operation image of the film forming apparatus according to the embodiment of the present disclosure.

DETAILED DESCRIPTION

In the following detailed description, reference is made to the accompanying drawings, which form a part thereof. The illustrative embodiments described in the detailed description, drawings, and claims are not meant to be limiting. Other embodiments may be utilized, and other changes may be made without departing from the spirit or scope of the subject matter presented here.

Figure 1:
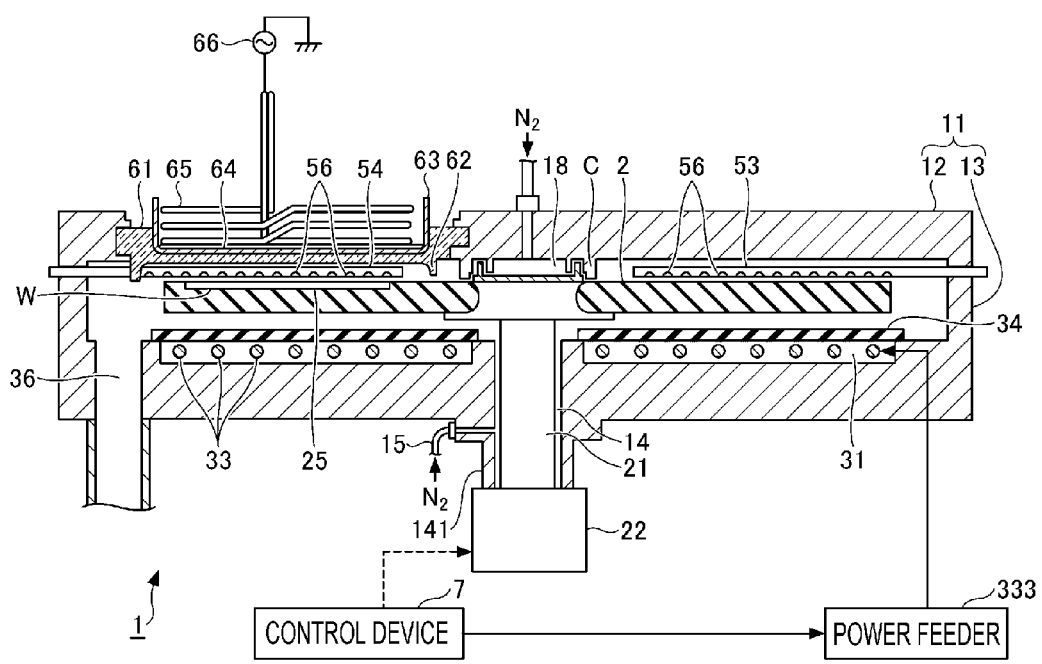
FIG. 1 is an example of a cross-sectional view of a film forming apparatus according to an embodiment of the present disclosure.
Figure 2:
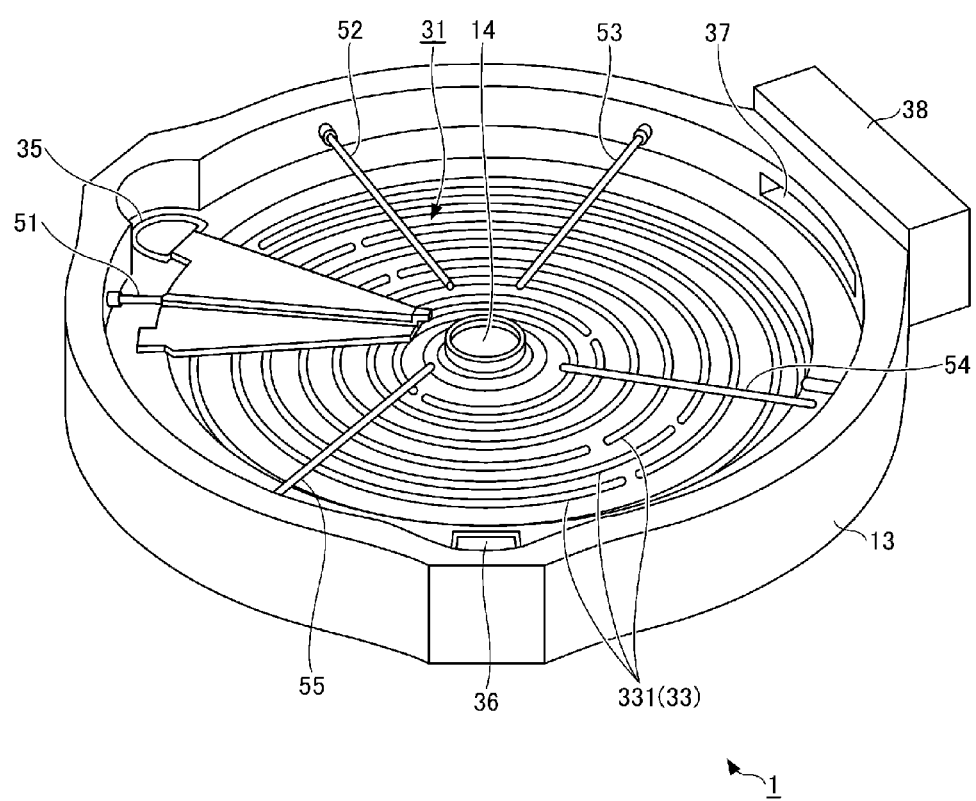
FIG. 2 is an example of an exploded perspective view of the film forming apparatus according to the embodiment of the present disclosure.

In an embodiment of the present disclosure, a film forming apparatus 1 which is a heat treatment apparatus will be described. FIG. 1 illustrates an example of a cross-sectional view of the film forming apparatus according to the present embodiment. FIG. 2 illustrates an example of an exploded perspective view of the film forming apparatus according to the present embodiment.

The film forming apparatus 1 forms a film on a wafer W which is an example of a processing target. For example, the film forming apparatus 1 causes a raw material gas to be adsorbed onto the wafer W, and then, supplies an oxidizing gas to the surface of the wafer W to form a molecular layer thereon. The film forming apparatus 1 exposes the wafer W to plasma generated from a plasma generation gas, to modify the molecular layer. The film forming apparatus 1 repeatedly performs the series of processes on the wafer W multiple times, thereby forming a film thereon. The raw material gas and the oxidizing gas are examples of a processing gas.

The film forming apparatus 1 includes a substantially circular flat processing container 11 and a disk-shaped rotary table 2 provided in the processing container 11. The rotary table 2 is an example of a stage configured to place the wafer W thereon. The processing container 11 is configured with a ceiling plate 12, and a container main body 13 that makes up the side wall and the bottom of the processing container 11.

The rotary table 2 is made of, for example, quartz glass (hereinafter, referred to as quartz), and is provided with a metal rotary shaft 21 that extends vertically downward at the center thereof. The rotary shaft 21 is inserted into a sleeve 141 having an opening 14 formed in the bottom of the container main body 13. The rotary shaft 21 is connected to a rotation driver 22 provided at the lower end of the sleeve 141 to airtightly close the processing container 11. The rotary table 2 is horizontally supported in the processing container 11 via the rotary shaft 21, and rotates by the operation of the rotation driver 22.

In order to prevent, for example, the raw material gas and the oxidizing gas from flowing from the upper surface of the rotary table 2 to the lower surface thereof, a gas nozzle 15 is provided at the upper end of the sleeve 141 to supply $N_2$ (nitrogen) gas into the gap between the opening 14 of the container main body 13 and the sleeve 141, and the rotary shaft 21.

Meanwhile, a central region C is formed on the lower surface of the ceiling plate 12 of the processing container 11, to protrude toward the center of the rotary table 2 and has an annular shape in plan view. The gap between the central region C and the center of the rotary table 2 serves a flow path 18 for $N_2$ gas.

The $N_2$ gas is supplied to the flow path 18 from a gas supply pipe connected to the ceiling plate 12. The $N_2$ flowing into the flow path 18 is discharged from the gap between the upper surface of the rotary table 2 and the central region C, outward in the radial direction of the rotary table 2 over the entire circumference of the gap. The $N_2$ gas prevents the raw material gas and the oxidizing gas that are supplied at different positions on the rotary table 2, from coming into contact with each other by bypassing the center (the flow path 18) of the rotary table 2.

The exploded perspective view of FIG. 2 illustrates a state where the ceiling plate 12 and the rotary table 2 are removed from the film forming apparatus 1. A flat annular recess 31 is formed in the bottom surface of the container main body 13 positioned below the rotary table 2, along the circumferential direction of the rotary table 2. A heater 33 is disposed on the bottom surface of the recess 31 over the region facing the entire bottom surface of the rotary table 2.

The heater 33 is configured by combining a large number of heater elements 331 including elongated tubular carbon wire heaters each formed in an arc shape having, for example, a length of ten or more centimeters to several tens of centimeters. By combining the plurality of arc-shaped heater elements 331, the heater 33 is arranged in the recess 31 to draw a plurality of concentric circles centered on the rotary shaft 21.

The heater 33 is arranged in a state of floating from the bottom surface of the recess 31 to be substantially parallel to the bottom surface of the recess 31 when viewed from side. Both ends of the heater 33 are bent downward, and are connected to a power feeder 333 provided outside the processing container 11 via a connection port penetrating the bottom plate of the container main body 13. A control device 7 controls the power feeder 333. For example, the control device 7 may divide the region where the heater 33 is arranged, and adjust the output of the heater 33 for each divided region. The upper surface of the recess 31 in which the heater 33 is arranged is covered with a shield 34 which is an annular plate member made of, for example, quartz.

Exhaust ports 35 and 36 are formed in the bottom surface of the container main body 13 positioned close to the outer periphery of the recess 31 to exhaust the inside of the processing container 11. A vacuum exhaust mechanism (not illustrated) configured with, for example, a vacuum pump is connected to the exhaust ports 35 and 36.

On the side wall of the container main body 13, a carry in/out port 37 for the wafer W and a gate valve 38 for opening/closing the carry in/out port 37 are provided. The wafer W held by an external transfer mechanism is carry into the processing container 11 through the carry in/out port 37. A plurality of recesses 25 is formed in the upper surface of the rotary table 2 to surround the flow path 18 of the central region and serves as placing regions of wafers W. Each wafer W carried into the processing container 11 is placed in each recess 25. The transfer of the wafer W between the transfer mechanism and the recess is performed by lifting pins configured to be movable up and down between the upper position and the lower position of the rotary table 2 via through holes (not illustrated) provided in each recess 25. However, descriptions of the lifting pins are omitted herein.

A raw material gas nozzle 51, a separation gas nozzle 52, an oxidizing gas nozzle 53, a plasma gas nozzle 54, and a separation gas nozzle 55 are arranged above the rotary table 2 at intervals along the rotation direction of the rotary table 2. A large number of ejection holes 56 are formed in the lower surface of each of the gas nozzles at intervals, and each gas is ejected downward from the ejection holes 56.

A plasma forming unit 61 is inserted into the opening of the ceiling plate 12, is made of a dielectric material such as quartz, has a planar shape corresponding to the opening, and has a side surface with a cup-shaped vertical cross-section. A ridge 62 is provided in the lower surface of the plasma forming unit 61 along the circumferential edge of the plasma forming unit 61. The plasma gas nozzle 54 is inserted into the region surrounded by the ridge 62 to eject a gas therein.

A recess is formed in the upper surface of the plasma forming unit 61. A box-shaped Faraday shield 63 opened at the upper surface thereof is disposed in the recess. A plate member 64 for insulation is disposed on the bottom surface of the Faraday shield 63. An antenna 65 for a plasma generation is provided on the upper surface of the plate member 64, is formed by wrapping a metal wire around a vertical axis in a coil shape, and is connected to a radio-frequency power supply 66.

The film forming apparatus 1 is provided with the control device 7 including a computer for controlling the operation of the entire apparatus. The control device 7 stores a program for controlling the operation of the entire apparatus. By executing the program, the control device 7 transmits a control signal to each component of the film forming apparatus 1 to control the operation of each component.

The control device 7 controls, for example, an adjustment of supply amounts of various gases, an output of the heater 33, an adjustment of supply amount of $N_2$ gas, and an adjustment of rotation speed of the rotary table 2 by the rotation driver 22. The program is installed in the control device 7 from a storage medium such as a hard disk, a compact disk, a magneto-optical disk, a memory card, and a flexible disk.

The control device 7 controls the operation of the film forming apparatus 1 such that the film forming process is performed under various process conditions present in a recipe. In the recipe, process conditions for a process including, for example, 20 to 30 steps are set. Further, the control device 7 may display a screen for receiving an input of information from an operator, and a screen for outputting information such as results to the operator. The control device 7 may be equipped in the film forming apparatus 1, or may be connected to the film forming apparatus 1 via a communication line.

The communication line may be a wired communication system or a wireless communication system, and may be any communication line for exchanging various signals inside and outside the computer. As for the communication line, a network such as a local area network (LAN) may be used.

In the film forming apparatus 1 having the configuration described above, the rotary table 2 is heated by the heater 33, and the wafer W placed in each recess 25 is heated via the rotary table 2. The film forming apparatus 1 according to the present embodiment has a temperature correction function executed according to a cumulative film thickness of deposits adhering to the inside of the processing container 11 due to the film forming process (hereinafter, referred to as a cumulative film thickness temperature correction function).

The cumulative film thickness temperature correction function uses a temperature correction table that represents an association between a value of the cumulative film thickness of the processing container 11 and a temperature correction amount. Details of the temperature correction table will be described later. The value of the cumulative film thickness of the processing container 11 increases by the film forming process, and is reset to "0" by an execution of a dry cleaning process or a wet cleaning. It is assumed that the dry cleaning process is performed more frequently than the wet cleaning.

In the processing container 11 in which the value of the cumulative film thickness has decreased by the dry cleaning process, cracks (e.g., fractures or breaks) of the rotary table 2 increase, and a value of a film thickness of the wafer W formed by the film forming process decreases due to an increase in consumption of the processing gas resulting from an increase in surface area. The value of the film thickness of the wafer W which has decreased due to the dry cleaning process gradually recovers as the value of the cumulative film thickness increases, and returns to the value of the film thickness of the wafer W before the dry cleaning process when the value of the cumulative film thickness reaches, for example, 5 μm or more. In this manner, the cumulative film thickness temperature correction function corrects the temperature of the heater 33 with the temperature correction amount corresponding to the value of the cumulative film thickness, thereby adjusting the value of the film thickness of the wafer W to be formed by the film forming process.

When the dry cleaning process is repeated, cracks continue to increase in the processing container 11, and thus, the value of the film thickness of the wafer W formed by the film forming process may further decrease. The film forming apparatus 1 according to the present embodiment uses a temperature correction table corresponding to a frequency of a dry cleaning process, to implement the cumulative film thickness temperature correction function corresponding to the frequency of the dry cleaning process.

Figure 3:
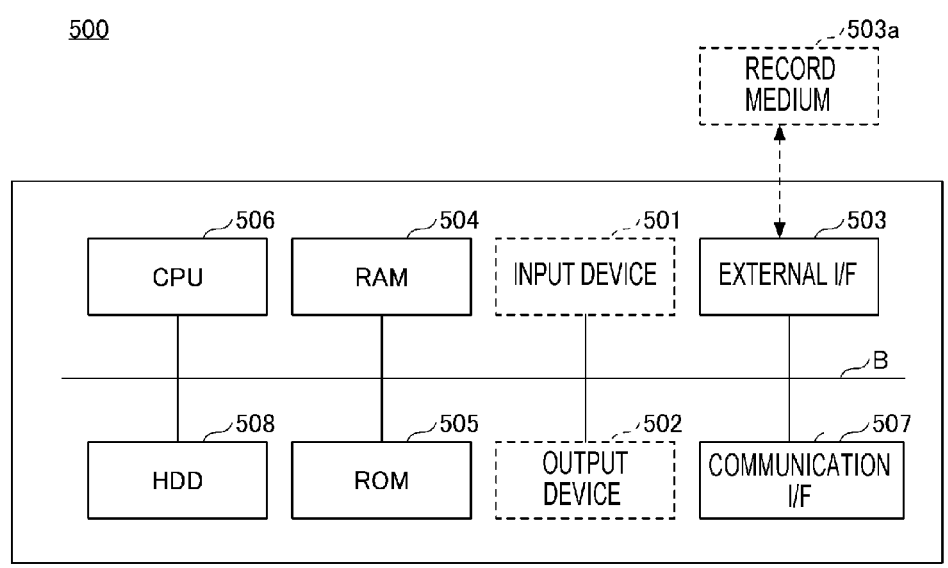
FIG. 3 is a hardware configuration diagram of an example of a computer.

The control device 7 is implemented by, for example, a computer 500 having the hardware configuration illustrated in FIG. 3. FIG. 3 is a hardware configuration diagram of an example of the computer.

The computer 500 of FIG. 3 includes, for example, an input device 501, an output device 502, an external interface (I/F) 503, a random access memory (RAM) 504, a read only memory (ROM) 505, a central processing unit (CPU) 506, a communication OF 507, and a hard disk drive (HDD) 508, and are connected to each other by a bus B. The input device 501 and the output device 502 may be connected and used when necessary.

The input device 501 is, for example, a keyboard, a mouse, or a touch panel, and is used when operators input each operation signal. The output device 502 is, for example, a display, and displays results of process executed by the computer 500. The communication OF 507 is provided to connect the computer 500 to, for example, a network. The HDD 508 is an example of a nonvolatile storage device that stores programs or data.

The external OF 503 is an interface with an external device. The computer 500 may perform reading and/or writing with respect to a record medium 503a such as a secure digital (SD) memory card via the external OF 503. The ROM 505 is an example of a nonvolatile semiconductor memory (storage device) in which programs or data are stored. The RAM 504 is an example of a volatile semiconductor memory (storage device) that temporarily stores programs or data.

The CPU 506 is an arithmetic device that implements the control or functions of the entire computer 500 by reading programs or data from the storage device such as the ROM 505 or the HDD 508 onto the RAM 504, and executing processes.

Figure 4:
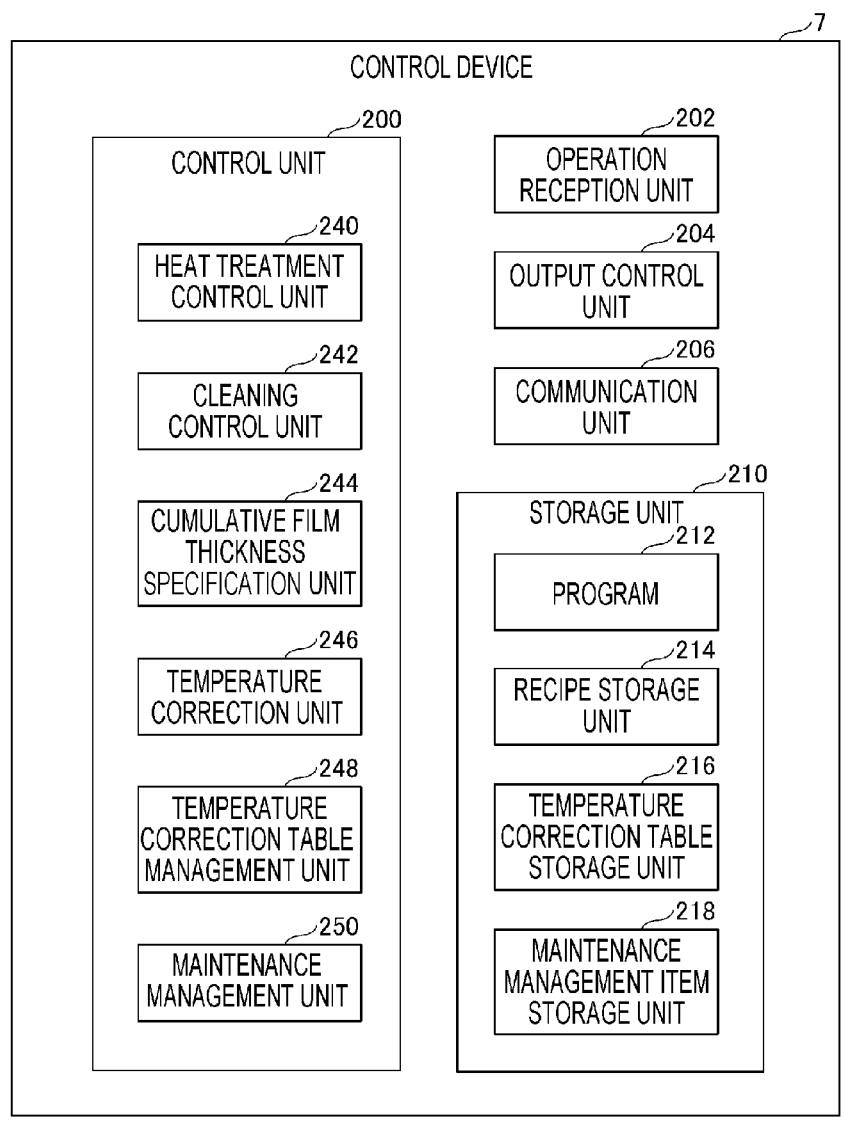
FIG. 4 is a view illustrating an example of a functional configuration of a control device according to the embodiment of the present disclosure.

The control device 7 illustrated in FIG. 1 may implement various functions of FIG. 4 in the manner that the computer 500 having the hardware configuration illustrated in FIG. 3 executes processes according to programs.

FIG. 4 is a view illustrating an example of a functional configuration of the control device according to the present embodiment. The control device 7 illustrated in FIG. 4 includes a control unit 200, an operation reception unit 202, an output control unit 204, a communication unit 206, and a storage unit 210.

The storage unit 210 of FIG. 4 includes a program 212, a recipe storage unit 214, a temperature correction table storage unit 216, and a maintenance management item storage unit 218. The storage unit 210 may be implemented by the HDD 508, or may be implemented by a storage device communicably connected via, for example, a network. The program 212 is an example of the program that controls the operation of the entire film forming apparatus 1.

The recipe storage unit 214 stores a recipe in which process conditions for a process to be executed by the film forming apparatus 1 are set. The temperature correction table storage unit 216 stores the temperature correction table to be described later. The maintenance management item storage unit 218 stores maintenance management items such as the frequency of the dry cleaning process and the value of the cumulative film thickness.

The control unit 200 controls the entire film forming apparatus 1. The control of the entire film deposition apparatus 1 includes, for example, a control of a process of storing the recipe, a control of a process of storing the temperature correction table, a control of a process of storing the maintenance management items, a control of the film forming process according to the recipe, a control of a process of the cumulative film thickness temperature correction function, and a control of the dry cleaning process, which are based on operations received from the operator.

The control unit 200 is implemented in the manner that the CPU 506 executes a process described in a program such as the program 212. The control unit 200 of FIG. 4 includes a heat treatment control unit 240, a cleaning control unit 242, a cumulative film thickness specification unit 244, a temperature correction unit 246, a temperature correction table management unit 248, and a maintenance management unit 250.

The heat treatment control unit 240 controls the operation of the film forming apparatus 1 such that the film forming process is performed under the process conditions of the process present in the recipe. The cleaning control unit 242 controls the operation of the film forming apparatus 1 such that the dry cleaning process is performed. The cumulative film thickness specification unit 244 specifies the value of the cumulative film thickness of deposits adhering to the processing container 11, based on the recipe used for the film forming process. The maintenance management unit 250 stores and manages the maintenance management items including the frequency of the dry cleaning process and the value of the cumulative film thickness, in the maintenance management item storage unit 218.

The temperature correction table management unit 248 stores and manages the temperature correction table to be described later, in the temperature correction table storage unit 216. Further, the temperature correction table management unit 248 accepts an editing operation for the temperature correction table from operators, and edits the temperature correction table stored in the temperature correction table storage unit 216.

The temperature correction unit 246 reads the temperature correction amount corresponding to the value of the cumulative film thickness and the frequency of the dry cleaning process from the temperature correction table, and corrects the temperature of the heater 33 with the read temperature correction amount, thereby adjusting the value of the film thickness of the wafer W to be filmed by the film forming process.

The operation reception unit 202 receives various operations performed by the operator on the input device 501. The output control unit 204 displays various screens on the output device 502 according to the control of the control unit 200. The operation reception unit 202 is implemented in the manner that the CPU 506 controls the input device 501 according to the program 212. The output control unit 204 is implemented in the manner that the CPU 506 controls the output device 502 according to the program 212. The various operations performed by the operator on the input device 501 refer to operations in which the operator operates the operation reception unit 202 in order to cause the CPU 506 to execute processes. The output control unit 204 displays various screens and outputs sounds according to the control of the control unit 200.

The communication unit 206 conducts a communication via, for example, a network. The communication unit 206 is implemented in the manner that the CPU 506 executes the program 212, and controls the communication I/F 507 according to the program 212.

The temperature correction table management unit 248 displays an edit screen 1000 illustrated in FIG. 5, and accepts an editing of the temperature correction table from the operator. FIG. 5 is an image view of an example of the edit screen. The edit screen 1000 of FIG. 5 includes a dry cleaning frequency edit field 1002 and a temperature correction table edit field 1004.

The dry cleaning frequency edit field 1002 includes a table selection button 1010 and a field 1012 for setting a dry cleaning frequency for each temperature correction table. The table selection button 1010 of FIG. 5 represents an example where the operator may select temperature correction tables of "Table 1" to "Table 10." The operator may perform an operation of selecting the table selection button 1010, so as to switch a temperature correction table to be displayed in the temperature correction table edit field 1004. Further, the operator may set the frequency of the dry cleaning process in the field 1012 for setting the dry cleaning frequency, so as to set the association between the frequency of the dry cleaning process and the temperature correction table.

For example, the edit screen 1000 of FIG. 5 represents a state where the table selection button 1010 of "Table 1" is selected, and the temperature correction table edit field 1004 displays the temperature correction table of "Table 1." In the temperature correction table, an association between a reference film thickness and a temperature correction amount for each region is recorded, so that the association between the value of the cumulative film thickness and the temperature correction amount may be linearly interpolated.

In the example of FIG. 5, ten reference film thicknesses may be set in association with "Line 1" to "Line 10." The edit screen 1000 of FIG. 5 represents an example where "Line 1" to "Line 5" are displayed. By pressing a next page button 1008, the operator may switch the screen to the edit screen 1000 that displays "Line 6" to "Line 10."

"Region 1" to "Region 5" in the temperature correction table edit field 1004 of FIG. 5 represent, for example, regions obtained by dividing the region heated by the heater 33 inside the processing container 11. For example, in the region inside the processing container 11, the outer side of the rotary table 2 may be set as "Region 1," the inner side of the rotary table 2 may be set as "Region 5," the intermediate between "Region 1" and "Region 5" may be set as "Region 3," the intermediate between "Region 1" and "Region 3" may be set as "Region 2," and the intermediate between "Region 3" and "Region 5" may be set as "Region 4."

In the example of FIG. 5, a temperature correction amount of each region is set for each of the reference film thicknesses of "Line 1" to "Line 10." The temperature correction amount may be set within a set range of a correction temperature. The temperature of each region determined by the recipe is corrected according to the temperature correction amount. When the "value of the cumulative film thickness" stored as a maintenance management item falls outside the range of the reference film thickness in the temperature correction table of FIG. 5, the temperature correction amounts of the respective regions of "Line 1" with the minimum reference film thickness or "Line 10" with the maximum reference film thickness may be adopted.

By pressing a table reset button 1006 of the edit screen 1000, the operator may reset the data of the temperature correction table being selected on the edit screen 1000 to "0" as illustrated in, for example, FIG. 6. The operator may perform a switching between "enabled" and "disabled" of the cumulative film thickness temperature correction function. FIG. 6 is an image view illustrating an example of the edit screen in which the data of the temperature correction table are reset.

The "frequency of the dry cleaning process" stored as a maintenance management item is incremented by "1" when the dry cleaning process according to a cleaning recipe is normally completed. The "frequency of the dry cleaning process" stored as a maintenance management item should be reset to "0" after, for example, a wet cleaning or a susceptor replacement for placing the wafer W is performed. In the film forming apparatus 1 according to the present embodiment, the "frequency of the dry cleaning process" stored as a maintenance management item may be automatically or manually reset to "0."

Descriptions will be further made on the process of setting the frequency of the dry cleaning process in the field 1012 for setting the dry cleaning frequency. In the field 1012 for setting the dry cleaning frequency, the frequency of the dry cleaning process may be set in an input range of, for example, "0" to "99."

The present embodiment does not use a temperature correction table in which "0" is set in the field 1012 for setting the dry cleaning frequency. FIG. 7 is an image view of an example of the edit screen on which an unused temperature correction table is set. In the edit screen 1000 of FIG. 7, the temperature correction tables of "Table 1" and "Table 6" are not used.

In the present embodiment, a numerical value other than "0" may not be repeatedly set in the field 1012 for setting the dry cleaning frequency. When a numerical value other than "0" is repeatedly set in the field 1012 for setting the dry cleaning frequency, for example, a pop-up error may be displayed.

By setting the frequency of the dry cleaning process in the field 1012 for setting the dry cleaning frequency, the operator may implement the cumulative film thickness temperature correction function by using one temperature correction table corresponding to the frequency of the dry cleaning process, as illustrated in FIGS. 8A and 8B.

FIGS. 8A and 8B are views illustrating an example of a process of selecting one temperature correction table corresponding to the frequency of the dry cleaning process. The temperature correction unit 246 of the control device 7 compares the frequency of the dry cleaning process set in the field 1012 for setting the dry cleaning frequency, and the frequency of the dry cleaning process stored as a maintenance management item (hereinafter, referred to as an integrated value of the dry cleaning process), and selects a temperature correction table to be used as follows.

When the integrated value of the dry cleaning process falls below the frequency of the dry cleaning process set in the field 1012 for setting the dry cleaning frequency, the temperature correction unit 246 does not select the temperature correction table. When the integrated value of the dry cleaning process matches the frequency of the dry cleaning process set in the field 1012 for setting the dry cleaning frequency, the temperature correction unit 246 selects the matching temperature correction table.

When the integrated value of the dry cleaning process does not fall below and does not match the frequency of the dry cleaning process set in the field 1012 for setting the dry cleaning frequency, the temperature correction unit 246 selects a temperature correction table in which the frequency of the dry cleaning process is closest to and falls below the integrated value of the dry cleaning process.

When the integrated value of the dry cleaning process exceeds the frequency of the dry cleaning process set in the field 1012 for setting the dry cleaning frequency, the temperature correction unit 246 selects a temperature correction table in which the frequency of the dry cleaning process is closest to and falls below the integrated value of the dry cleaning process.

For example, in the case of the dry cleaning frequency edit field 1002 of FIG. 8A, when the integrated value of the dry cleaning process is "0 time" to "99 times," the temperature correction unit 246 may select a temperature correction table as illustrated in FIG. 8B.

When the integrated value of the dry cleaning process is "0 times" to "2 times," the integrated value of the dry cleaning process falls below the frequency of the dry cleaning process set in the field 1012 for setting the dry cleaning frequency. Thus, the temperature correction unit 246 does not select a temperature correction table, and does not perform the cumulative film thickness temperature correction.

When the integrated value of the dry cleaning process is "3 times" to "6 times," the integrated value of the dry cleaning process matches the frequency of the dry cleaning process set in the field 1012 for setting the dry cleaning frequency. Thus, the temperature correction unit 246 performs the cumulative film thickness temperature correction by using the matching temperature correction table.

When the integrated value of the dry cleaning process is "7 times," the integrated value of the dry cleaning process does not match the frequency of the dry cleaning process set in the field 1012 for setting the dry cleaning frequency. Thus, the temperature correction unit 246 corrects the cumulative film thickness temperature by using the temperature correction table of "Table 5" in which the frequency of the dry cleaning process is closest to and falls below the integrated value of the dry cleaning process.

When the integrated value of the dry cleaning process is "8 times" to "11 times," the integrated value of the dry cleaning process matches the frequency of the dry cleaning process set in the field 1012 for setting the dry cleaning frequency. Thus, the temperature correction unit 246 performs the cumulative film thickness temperature correction by using the matching temperature correction table.

When the integrated value of the dry cleaning process is "12 times" to "99 times," the integrated value of the dry cleaning process exceeds the frequency of the dry cleaning process set in the field 1012 for setting the dry cleaning frequency. Thus, the temperature correction unit 246 performs the cumulative film thickness temperature correction by using the temperature correction table of "Table 10" in which the frequency of the dry cleaning process is closest to and falls below the integrated value of the dry cleaning process.

For example, during the operation illustrated in FIG. 9, the film forming apparatus 1 according to the present embodiment selects a temperature correction table according to the integrated value of the dry cleaning process, and performs the cumulative film thickness temperature correction by using the selected temperature correction table. FIG. 9 is a flowchart illustrating an example of an operation image of the film forming apparatus according to the present embodiment.

In step S100, the film forming apparatus 1 performs a dummy Run. The dummy Run is a process of forming a film on a member in the processing container 11 in order to adjust the film forming state of the wafer W, before performing the film forming process on the wafer W. The dummy Run is performed until the cumulative film thickness reaches, for example, 1 µm.

In step S102, the film forming apparatus 1 performs a production process including the film forming process on the wafer W until the cumulative film thickness reaches a predetermined value (e.g., 10 µm). Since the frequency of the dry cleaning process stored as a maintenance management item is "0," the temperature correction unit 246 does not select a temperature correction table as described above, and does not perform the cumulative film thickness temperature correction.

The value of the cumulative film thickness stored as a maintenance management item is specified by the cumulative film thickness specification unit 244 based on the recipe used for performing the film forming process. The value of the cumulative film thickness may be integrated and updated each time a process including, for example, 20 to 30 steps is completed, or may be integrated and updated each time a step is completed. When the cumulative film thickness reaches a predetermined value (e.g., 10 µm), the film forming apparatus 1 proceeds to step S104 after the process is ended.

In step S104, the film forming apparatus 1 performs a first dry cleaning process. The dry cleaning process is a process of supplying a cleaning gas into the processing container 11 to remove deposits adhering to the inside of the processing container 11.

When the dry cleaning process is completed, the film forming apparatus 1 adds "1" to the frequency of the dry cleaning process stored as a maintenance management item.

Further, the film forming apparatus 1 resets the value of the cumulative film thickness stored as a maintenance management item to "0."

In step S106, the film forming apparatus 1 performs the dummy Run. In step S108, the temperature correction unit 246 selects the temperature correction table corresponding to the frequency of the dry cleaning process stored as a maintenance management item as described above.

For example, in the example of FIG. 5, when the frequency of the dry cleaning process stored as a maintenance management item is "1," the temperature correction unit 246 selects the temperature correction table of "Table 1."

In step S110, the film forming apparatus 1 performs the production process including the film forming process on the wafer W until the cumulative film thickness reaches a predetermined value (e.g., 10 μm). During the production process of step S110, the temperature correction unit 246 performs the cumulative film thickness temperature correction by using the temperature correction table selected in step S108. For example, in the example of FIG. 5, when the cumulative film thickness value stored as a maintenance management item is "150 nm," the temperature correction unit 246 performs the cumulative film thickness temperature correction by using the temperature correction amounts of "Line 2."

When the cumulative film thickness reaches a predetermined value (e.g., 10 μm), the film forming apparatus 1 proceeds to step S112 after the process is ended. In step S112, the film forming apparatus 1 performs a second or subsequent dry cleaning process.

When the dry cleaning process is completed, the film forming apparatus 1 adds "1" to the frequency of the dry cleaning process stored as a maintenance management item. Further, the film forming apparatus 1 resets the value of the cumulative film thickness stored as a maintenance management item to "0."

In step S114, the film forming apparatus 1 determines whether the sum of the values of the cumulative film thickness is equal to or larger than a predetermined value (e.g., 160 μm). The sum of the values of the cumulative film thickness is the sum of values of the cumulative film thickness that have been reset to "0" by the dry cleaning process. When it is determined that the sum of the values of the cumulative film thickness is not equal to or larger than the predetermined value (e.g., 160 μm), the film forming apparatus 1 returns to step S106 and continues the process.

When it is determined that the sum of the values of the cumulative film thickness is equal to or larger than the predetermined value (e.g., 160 μm), the film forming apparatus 1 performs a wet cleaning in step S116. The wet cleaning is a process in which the operator removes the deposits adhering to the inside of the processing container 11.

In step S118, the film forming apparatus 1 resets the frequency of the dry cleaning process stored as a maintenance/management item to "0." In step S120, the film forming apparatus 1 resets the sum of the values of the cumulative film thickness used in step S114 to "0." When step S120 is completed, the film forming apparatus 1 returns to step S100 and continues the process.

As described above, according to the present embodiment, it is possible to provide a technique for correcting the temperature of the film forming process (heat treatment) according to the frequency of the dry cleaning process on deposits adhering to the processing container 11.

For example, in the present embodiment, one control device 7 corresponds to one film forming apparatus 1. However, one control device 7 may correspond to a plurality of film forming apparatuses 1. The functions of the control device 7 may be provided in a host computer or a cloud computer communicably connected to the film forming apparatus 1.

According to the present disclosure, it is possible to provide a technique for correcting a temperature of a heat treatment according to a frequency of a dry cleaning process on deposits adhering to a processing container.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A heat treatment apparatus comprising:
   a processing container configured to accommodate a processing target;
   a stage configured to dispose the processing target in the processing container;
   a heater configured to heat the stage based on a temperature of a heat treatment according to a process condition; and
   a controller configured to control an overall operation of the heat treatment apparatus,
   wherein the controller includes:
   a heat treatment control circuitry configured to control the heat treatment performed on the processing target accommodated in the processing container, according to the process condition,
   a cleaning control circuitry configured to control a cleaning process on deposits adhering to the processing container due to the heat treatment,
   a cumulative film thickness specification circuitry configured to specify a value of a cumulative film thickness of the deposits adhering to the processing container, based on the process condition for the heat treatment, and
   a temperature correction circuitry configured to select, from a plurality of temperature correction tables for each of a plurality of execution frequencies of the cleaning process, a temperature correction table corresponding to an execution frequency of the cleaning process, and correct the temperature of the heat treatment based on a temperature correction amount corresponding to the value of the cumulative film thickness with reference to the temperature correction table, each of the plurality of temperature correction tables representing an association between the value of the cumulative film thickness and the temperature correction amount,
   wherein the heat treatment control circuitry is configured to control the heater based on the corrected temperature corrected by the temperature correction circuitry to perform the heat treatment on the processing target in order to form a film with a desired thickness on the processing target based on the corrected temperature.

2. The heat treatment apparatus according to claim 1, wherein the temperature correction table is configured to represent an association between a region of the processing container and the temperature correction amount, for each value of the cumulative film thickness.

3. The heat treatment apparatus according to claim 2, wherein the controller is configured such that the execution frequency of the cleaning process is increased by an execution of a dry cleaning process and reset by an execution of a wet cleaning.

4. The heat treatment apparatus according to claim 3, wherein the heater is configured to heat the stage based on the temperature of the heat treatment according to the process condition and the temperature correction amount.

5. The heat treatment apparatus according to claim 1, wherein the controller is configured such that the execution frequency of the cleaning process is increased by an execution of a dry cleaning process, and reset by an execution of a wet cleaning.

6. The heat treatment apparatus according to claim 1, wherein the heater is configured to heat the stage based on the temperature of the heat treatment according to the process condition and the temperature correction amount.

7. The heat treatment apparatus according to claim 1, wherein the controller is configured such that the execution frequency of the cleaning process is increased by an execution of a dry cleaning process, and reset by a replacement of a susceptor on which the processing target is placed.

8. The heat treatment apparatus according to claim 1, wherein when a first temperature correction table corresponding to a first execution frequency of the cleaning process does not exist among the plurality of temperature correction tables, the temperature correction circuitry selects a second temperature correction table corresponding to a second execution frequency of the cleaning process closest to the first execution frequency of the cleaning process.

9. A control method comprising:
providing a heat treatment apparatus including a controller and configured to perform a heat treatment on a processing target accommodated in a processing container and a heater configured to heat a stage on which the processing target is disposed in the processing container based on a temperature of the heat treatment according to a process condition; and
causing the controller to execute a process including:
controlling the heat treatment performed on the processing target accommodated in the processing container according to the process condition,
specifying a value of a cumulative film thickness of deposits adhering to the processing container due to the heat treatment, based on the process condition for the heat treatment,
selecting, from a plurality of temperature correction tables for each of a plurality of execution frequencies of a cleaning process on the deposits adhering to the processing container due to the heat treatment, a temperature correction table corresponding to an execution frequency of the cleaning process, the plurality of temperature correction tables representing an association between the value of the cumulative film thickness and the temperature correction amount,
correcting the temperature of the heat treatment based on a temperature correction amount corresponding to the value of the cumulative film thickness of the deposits adhering to the processing container with reference to the temperature correction table, and
controlling the heater based on the corrected temperature to perform the heat treatment on the processing target in order to form a film with a desired thickness on the processing target based on the corrected temperature.

10. A non-transitory computer-readable storage medium storing a program causing a controller of a heat treatment apparatus including a heater configured to heat a stage on which a processing target is disposed in a processing container based on a temperature of a heat treatment according to a process condition, which performs the heat treatment on the processing target accommodated in the processing container, to execute a process including:
controlling the heat treatment performed on the processing target accommodated in the processing container according to the process condition;
specifying a value of a cumulative film thickness of deposits adhering to the processing container due to the heat treatment, based on the process condition for the heat treatment;
selecting, from a plurality of temperature correction tables for each of a plurality of execution frequencies of a cleaning process on the deposits adhering to the processing container due to the heat treatment, a temperature correction table corresponding to an execution frequency of the cleaning process, the plurality of temperature correction tables representing an association between the value of the cumulative film thickness and the temperature correction amount;
correcting the temperature of the heat treatment based on a temperature correction amount corresponding to the value of the cumulative film thickness of the deposits adhering to the processing container with reference to the temperature correction table; and
controlling the heater based on the corrected temperature to perform the heat treatment on the processing target in order to form a film with a desired thickness on the processing target based on the corrected temperature.

* * * * *